(12) United States Patent
Chen et al.

(10) Patent No.: US 8,747,610 B2
(45) Date of Patent: Jun. 10, 2014

(54) PLASMA SOURCE PUMPING AND GAS INJECTION BAFFLE

(75) Inventors: Lee Chen, Cedar Creek, TX (US); Merritt Funk, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 37 days.

(21) Appl. No.: 13/436,760

(22) Filed: Mar. 30, 2012

(65) Prior Publication Data

US 2013/0256268 A1 Oct. 3, 2013

(51) Int. Cl.
*C23F 1/00* (2006.01)

(52) U.S. Cl.
USPC ............ 156/345.39; 156/345.3; 156/345.34; 438/731

(58) Field of Classification Search
USPC ............ 156/345.3, 345.33, 345.38, 345.39, 156/345.34; 438/706, 714, 729, 731
See application file for complete search history.

(56) References Cited

U.S. PATENT DOCUMENTS

| | | | |
|---|---|---|---|
| 6,051,100 A | 4/2000 | Walko, II | |
| 6,663,715 B1 * | 12/2003 | Yuda et al. | 118/723 R |
| 6,975,073 B2 | 12/2005 | Wakalopulos | |
| 7,416,677 B2 | 8/2008 | Takahashi | |
| 2008/0277062 A1* | 11/2008 | Koshimizu et al. | 156/345.28 |
| 2008/0295964 A1 | 12/2008 | Takahashi | |
| 2009/0090852 A1* | 4/2009 | Chen et al. | 250/251 |

* cited by examiner

*Primary Examiner* — Lan Vinh

(74) *Attorney, Agent, or Firm* — Wood, Herron & Evans, LLP

(57) ABSTRACT

A plasma processing system. The processing system comprises a process chamber having first and second ends arranged such that the first end opposes the second end. A substrate support is positioned at the first end of the process chamber and is configured to support a substrate. An exhaust system is positioned proximate the second end of the process chamber and draws a vacuum on the process chamber. Between the exhaust system and substrate support there is a plurality of super-Debye openings, and between the exhaust system and the plurality of super-Debye openings is a plurality of sub-Debye openings. The super-Debye openings are configured to limit diffusion of plasma while the sub-Debye openings are configured to quench plasma.

20 Claims, 6 Drawing Sheets

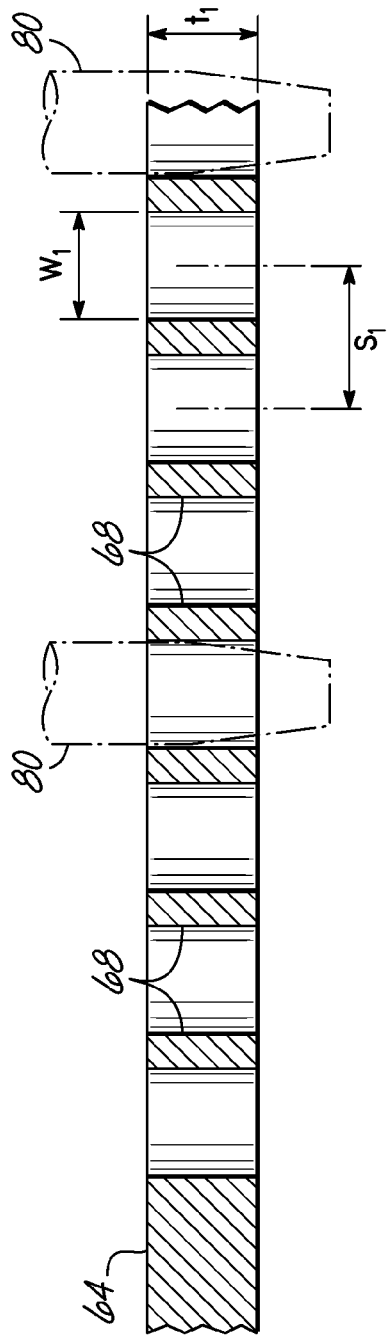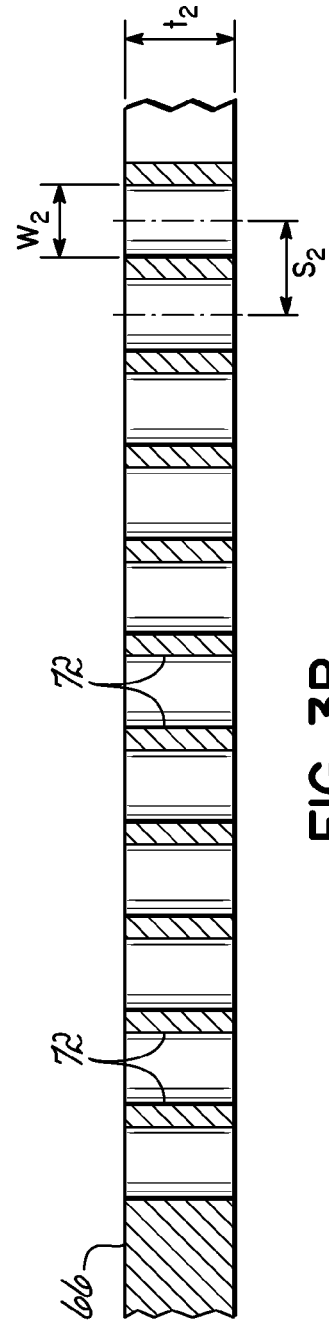
FIG. 3A
FIG. 3B

PLASMA SOURCE PUMPING AND GAS INJECTION BAFFLE

FIELD OF THE INVENTION

The present invention relates generally to an apparatus for plasma processing a substrate and, more particularly, to an apparatus for resisting movement of plasma from plasma-processing region.

BACKGROUND OF THE INVENTION

Plasma processing is often used under circumstances where it is beneficial to restrict the presence of the plasma to a certain plasma-containing region in a processing chamber while maintaining the ability to flow gases through the plasma-containing region. Several methods of plasma containment are known, including, for example, magnetic confinement, inertial confinement, and structural confinement by solid or nearly-solid barriers. Inertial confinement is operable for only short periods of time and has been shown useful only in power generating and explosive devices. Magnetic confinement has strong limitations in its applicability to many industrial applications. Because of these and other shortcomings of inertial and magnetic confinement systems, structural confinement using physical barriers is often used in industrial plasma confinement.

Known, conventional devices are arranged such that a substrate is positioned within a processing chamber and the plasma is formed between the substrate and an opposing side of the processing chamber, e.g., a processing surface of the substrate faces the plasma. This is most often achieved with a processing gas being injected from the opposing side and exhausted from the substrate side of the processing chamber by a turbo pump. However, at vacuum pressures the exhaust flow is slow, and if plasma is drawn from the plasma-containing region into the pump, then the plasma will damage the pump and/or cause other problems.

FIG. 1 illustrates one such plasma processing device 10. The particular arrangement of plasma processing device 10 with a gas injection assembly 12 and an exhaust assembly 14 as shown in FIG. 1 is prone to various problems. The device 10 comprises a processing chamber 16 configured to facilitate the formation of plasma 18 in a process space 20, a substrate holder 22 positioned within the plasma processing device 10 and configured to support a substrate 24 thereon. A vacuum pump 26 is coupled to the processing chamber 16 via pumping port 28 and configured to evacuate process gases from the process space 20.

Additionally, the plasma processing device 10 includes a plasma generation system 30 coupled to the plasma processing chamber 16 and configured to form the processing plasma 18 from a process gas injected into the process space 20.

A controller 38 is operably coupled to one or more of the plasma generating system 30, the vacuum pump 26, the gas injection assembly 12, and other components of the device 10 for controlling plasma processing of the substrate 24.

To overcome the problem associated with drawing plasma from the process space 20 and into the pump 26, the exhaust assembly 14 of FIG. 1 further includes a first exhaust baffle 32 positioned over the exhaust port 28. The first baffle 32 includes a plurality of openings extending therethrough, each of which has a diameter that is larger than one Debye length of the plasma 18. One of ordinary skill in the art would readily appreciate that the Debye length is the length over which the plasma 18 screens out electric fields. As such, the first baffle 32 allows the plasma 18 to pass through the openings. This quiescent plasma 34 between the first baffle 32 and the pumping port 28 is less intense than the main plasma 18 as it is not ignited by RF excitation but due to diffusion from the main plasma 18.

The exhaust assembly 14 further includes a second baffle 36 positioned between the first baffle 32 and the pumping port 28 and having a plurality of holes that are less than the Debye length. The quiescent plasma 34, being less intense than the main plasma 18, is quenched as it passes through the sub-Debye openings of the second baffle 36, rendering the exhaust assembly 14 stable and protecting the pump 26.

However, the device 10 as shown in FIG. 1 does not resolve the issues associated with slow exhaust. Therefore, there remains a need for a plasma processing system that protects the vacuum pump 26 from plasma damage while overcoming the slow exhaust.

SUMMARY OF THE INVENTION

The present invention overcomes the foregoing problems and other shortcomings and drawbacks of known plasma systems. While the present invention will be described in connection with certain embodiments, it will be understood that the present invention is not limited to these embodiments. To the contrary, this invention includes all alternatives, modifications, and equivalents as may be included within the spirit and scope of the present invention.

According to one embodiment of the present invention, a plasma processing system includes a process chamber having first and second ends. The first and second ends are arranged such that the first end opposes the second end. A substrate support is positioned at the first end of the process chamber and is configured to support a substrate. An exhaust system is positioned proximate the second end of the process chamber and draws a vacuum on the process chamber. Between the exhaust system and substrate support there is a plurality of super-Debye openings, and between the exhaust system and the plurality of super-Debye openings is a plurality of sub-Debye openings. The super-Debye openings are configured to limit diffusion of plasma while the sub-Debye openings are configured to quench plasma.

In accordance with another embodiment of the present invention, a plasma processing system includes a process chamber. A substrate is positioned within the process chamber on a substrate support such that a processing surface of the substrate faces a process space of the chamber. An exhaust system is positioned such that the process space is located between the processing surface of the substrate and the exhaust system. The exhaust system draws a vacuum on the process chamber. A plurality of super-Debye openings are positioned between the exhaust system and the processing surface of the substrate and configured to limit diffusion of plasma. A plurality of sub-Debye openings are positioned between the exhaust system and the plurality of super-Debye openings and configured to quench plasma.

Still another embodiment of the present invention is directed to a method of operating a plasma processing system. The plasma processing system includes a process chamber that is configured to process a substrate positioned therein. The method includes positioning the substrate on a substrate holder such that a processing surface of the substrate faces a process space within the process chamber. The process chamber is further configured to contain a plasma therein. Process gas is injected into the process space through a first plate and is configured to be ignited into the plasma. The first plate includes a plurality of super-Debye openings therein, each having a diameter that is greater than one Debye length of the ignited plasma. The plasma is ignited from the process gas and a vacuum pump is operated such that the process gas and plasma are drawn from the process space, through the plurality of super-Debye openings of the first plate, through a plurality of sub-Debye openings in a second plate, and to the vacuum pump. Each of the sub-Debye openings of the second plate has a diameter that is no greater than one Debye length of the ignited plasma.

In accord with another embodiment of the present invention, a plasma processing system includes a process chamber having first and second ends. The first and second ends are arranged such that the first end opposes the second end. A substrate support is positioned at the first end of the process chamber and is configured to support a substrate. A gas supply system having a gas injection port is fluidically coupled to the process chamber and configured to inject a process gas into the process chamber. Between the gas injection port and the substrate support there is a plurality of super-Debye openings, and between the gas injection port and the plurality of super-Debye openings is a plurality of sub-Debye openings. The super-Debye openings are configured to limit diffusion of plasma while the sub-Debye openings are configured to quench plasma.

One other embodiment of the present invention is directed to a plasma processing system includes a process chamber having first and second ends. The first and second ends are arranged such that the first end opposes the second end. A substrate support is positioned at the first end of the process chamber and is configured to support a substrate. A sensor, which is operably coupled to the process chamber, is configured to detect at least one process parameter within the process chamber. Between the sensor and substrate support there is a plurality of super-Debye openings, and between the sensor and the plurality of super-Debye openings is a plurality of sub-Debye openings. The super-Debye openings are configured to limit diffusion of plasma while the sub-Debye openings are configured to quench plasma.

BRIEF DESCRIPTION OF THE FIGURES

The accompanying drawings, which are incorporated in and constitute a part of this specification, illustrate embodiments of the present invention and, together with a general description of the invention given above, and the detailed description of the embodiments given below, serve to explain the principles of the present invention.

FIGS. 3A and 3B are enlarged views of first and second baffles comprising the exhaust baffle assembly of FIG. 3.

DETAILED DESCRIPTION

Figure 1:
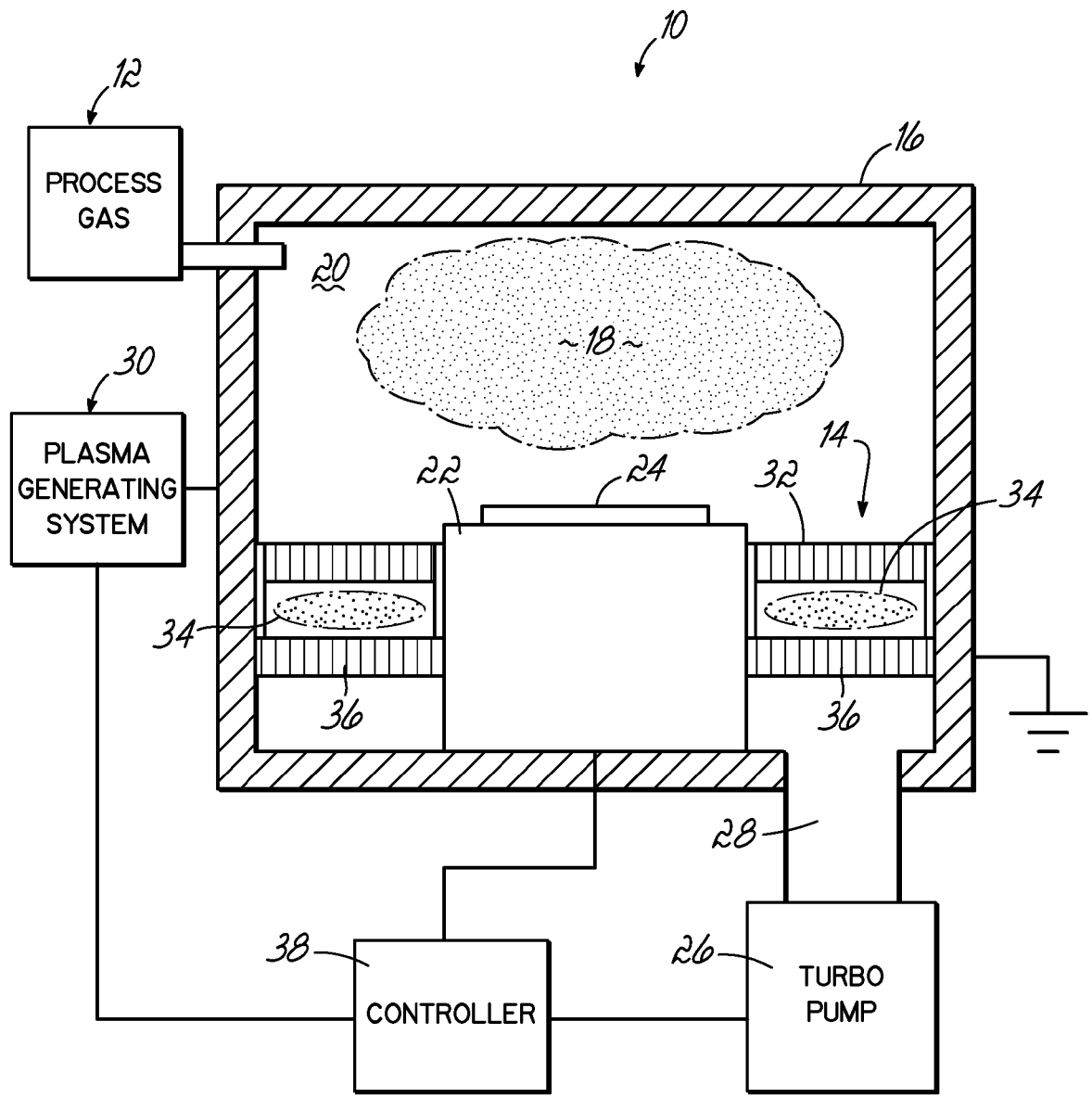
FIG. 1 is a schematic view of a plasma processing system, in cross-section, in accordance with one known prior art device.
Figure 2:
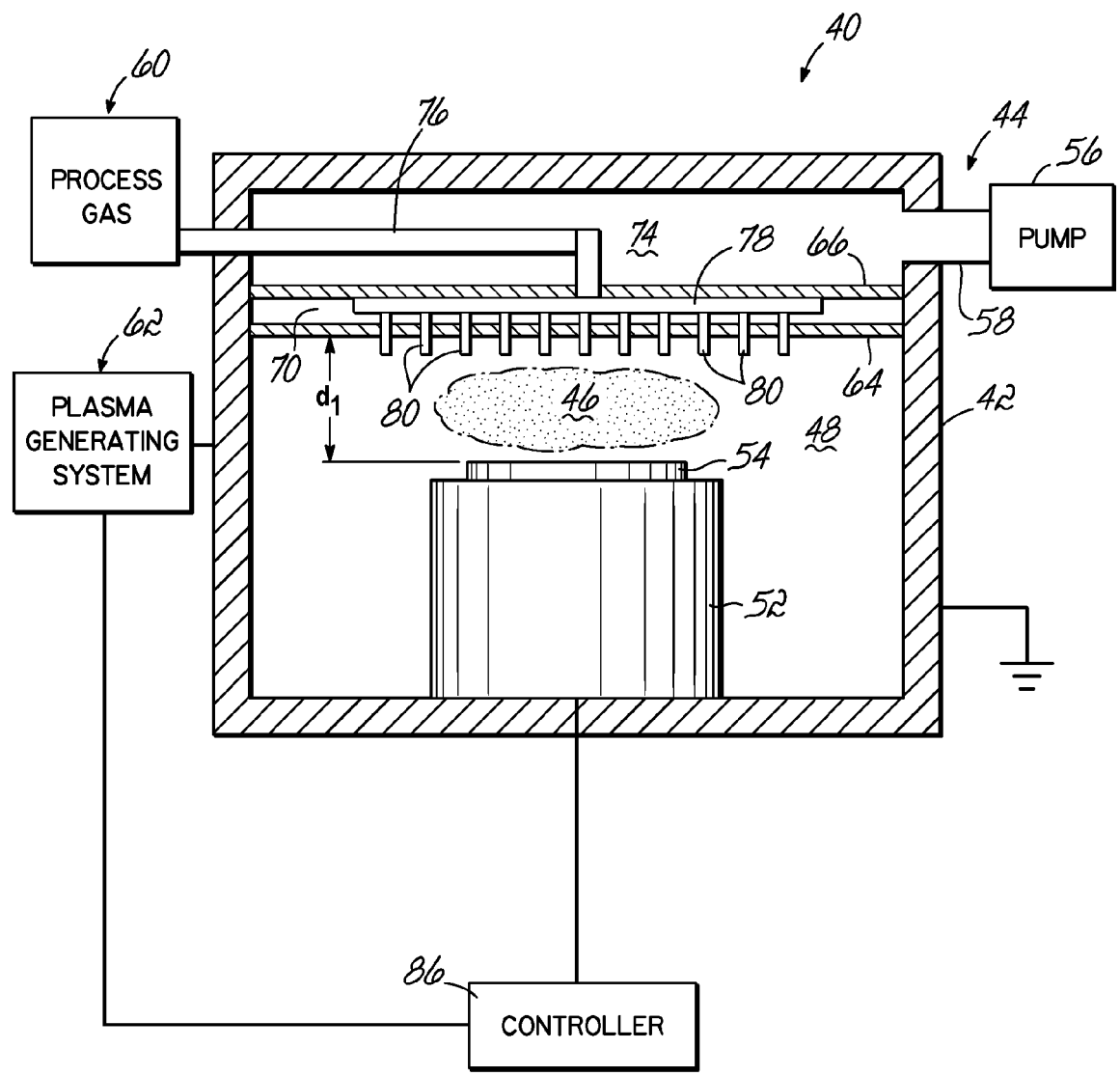
FIG. 2 is a schematic view of a plasma processing system, in cross-section, having an exhaust baffle assembly and in accordance with one embodiment of the present invention.

Turning now to the figures, and in particular to FIG. 2, a plasma processing system 40 with a process chamber 42 and an exhaust assembly 44 therein are provided according to one embodiment of the present invention. The process chamber 42 is configured to facilitate the formation of a plasma 46 in a process space 48, a substrate holder 52 coupled to one side of the process chamber 42 configured to support a substrate 54 thereon, and a vacuum pumping system 56 coupled to the process chamber 42 via a pumping port 58 and configured to evacuate process gases from the process space 48. As alluded to above, the substrate 54 is positioned on one end of the process chamber 42 while a process gas injection source 60 is proximate the opposing side of the process chamber 42 and the plasma 46 is ignited therebetween by a plasma generation system 62.

The plasma generation system 62 may comprise one or more of a capacitively coupled plasma ("CCP") system, an inductively coupled plasma ("ICP") system, a transformer coupled plasma ("TCP") system, an electron cyclotron resonance ("ECR") plasma system, a helicon wave plasma system, a surface wave plasma system, or a slotted plane antenna ("SPA") plasma system, any microwave and microwave surface wave, DC discharge, pulsed DC or a combination of two or more thereof. Each plasma system described above is well known to those skilled in the art.

Figure 3:
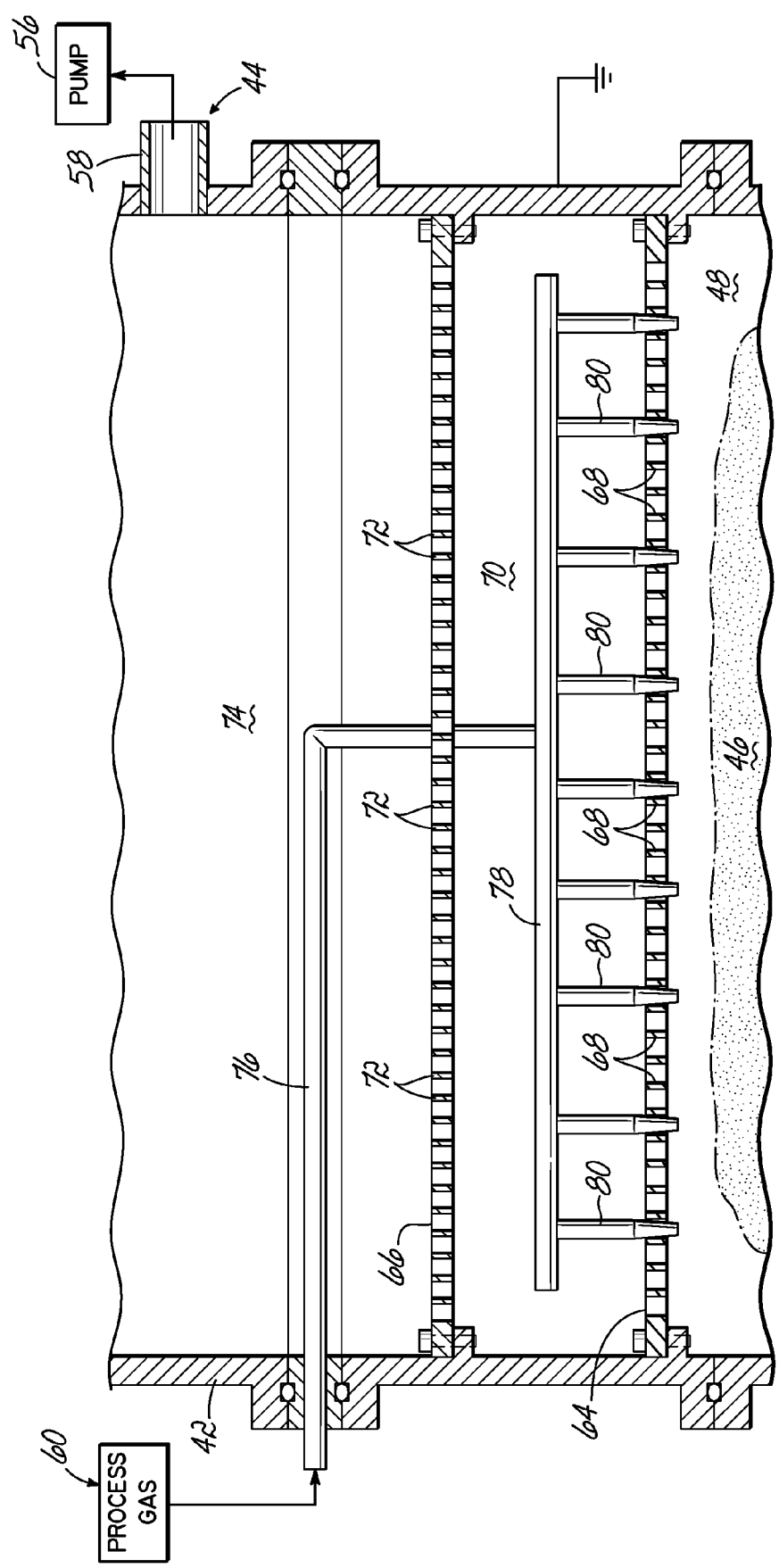
FIG. 3 is an enlarged view of the exhaust baffle assembly of FIG. 1.

Turning now to the exhaust assembly 44, and in particular to FIG. 3, the exhaust assembly 44 further comprises a first baffle plate 64 and a second baffle plate 66, each optionally coupled to an electrical ground, insulated (i.e., electrically-floating when exposed to a plasma), or referenced to a reference potential, such as a DC, RF, or AC potential. The first and second baffle plates 64, 66 are positioned on the side of the process chamber 42 that opposes the substrate 54 and such that the baffle plates 64, 66 are positioned between the substrate 54 and the pumping port 58.

The first baffle plate 64 may be spaced at a distance, $d_1$, away from the substrate 54. The distance, in some embodiments, may range from about 1 mm to about 1 m, but generally the distance may be approximately 25 mm. The first baffle plate 64 may be constructed from any suitably conductive, metallic material and may be coated, for example, with $Y_2O_3$. More specifically, the first baffle plate 64 may be fabricated from aluminum or anodized aluminum, for example, and coated with a ceramic, such as aluminum oxide, yttrium oxide, scandium oxide, scandium fluoride, yttrium fluoride, lanthanum oxide, and dysprosium oxide. In some embodiments, the coating may be about 100 μm thick.

The baffle plate 64 includes a plurality of super-Debye openings 68, each being larger than one Debye length of the plasma 46. While particular dimensions should not be considered to be limiting, the first baffle plate 64 may be approximately 1.5 mm thick, $t_1$, with each super-Debye opening 68 being approximately 1.5 mm in diameter, $w_1$, and having a spacing, $s_1$, of about 1.97 mm from an adjacent super-Debye opening 68. In that regard, a portion of the plasma 46 may dip into the super-Debye opening 68 and diffuse from the process space 48, as a quiescent plasma, into a quiescent space 70 (FIG. 3), which is located between the first and second baffle plates 64, 66. Dimensions of the quiescent space 70 (FIG. 3) are limited such that the volume constrained by the quiescent space 70 (FIG. 3) is insufficient for plasma ignition. In some embodiments, a height of the quiescent space 70 (FIG. 3), may be as small as the sub-Debye length.

Referring again to FIG. 3 and now to FIG. 3B, the second baffle plate 66 is positioned within the process chamber 42 such that the first baffle plate 64 is between the second baffle plate 66 and the substrate 54. The second baffle plate 66 may be constructed in the same manner as described above; however, the first and second baffle plates 64, 66 need not be constructed from the same materials. The second baffle plate 66 includes a plurality of sub-Debye openings 72 therein, wherein a diameter, $w_2$, of each sub-Debye opening 72 is less than the Debye length of the plasma 46. In some embodiments, the second baffle plate 66 may be positioned about 25 mm away from the first baffle plate 64 and about 50 mm away from the substrate 54.

The sub-Debye openings 72 of the second baffle plate 66 should be packed as closely as possible along the baffle plate 66 so as to maximize the total conductance of each baffle plate 64, 66. For example, the sub-Debye openings 72 may be hexagonally-shaped in cross section to maximize packing. Alternatively, a mesh-type material may be used, wherein the openings within the mesh are no greater than the Debye length of the plasma 46.

The shapes and sizes of the sub-Debye openings 72 and the super-Debye openings 68, the space separating the first and second baffle plates 64, 66, as well as the alignment of the openings 68, 72 of the first and second baffle plates 64, 66 may be optimized, such as by testing or simulation, so as to maximize gas transmission therethrough.

As was described above, while a portion of the plasma 46 may diffuse into the quiescent space 70 between the baffle plates 64, 66, the sub-Debye openings 72 of the second baffle plate 66 prevents plasma from entering an upper chamber space 74, which is positioned between the second baffle plate 66 and the vacuum pumping system 56. Accordingly, the vacuum pumping system 56 may be operable to pull a fast exhaust while the first and second baffle plates 64, 66 protect the vacuum pumping system 56 from plasma-based damage. The vacuum pumping system 56 may comprise, e.g., a turbopump.

With reference again to FIG. 3, and according to some embodiments of the present invention, injection of the process gases process gas source 60 from the may be provided through an inlet tube 76, entering into the upper chamber space 74 of the process chamber 42 from a side wall. The process gases from the process gas source 60 may then be distributed, via a manifold 78 positioned within the quiescent space 70, to an array of nozzles 80 that extend into the process space 48. As is shown, the nozzles 80 may extend through corresponding ones of the super-Debye openings 68 of the first baffle plate 64. In this way, the array of nozzles 80 may be operable much like a convention showerhead. The nozzles 80 should be further configured such that the process gases from the process gas source 60 are injected in the process space 48 above the substrate 54, and, according to some embodiments, about 1 inch above a processed surface of the substrate 54.

Referring again to FIG. 2, the plasma processing system 40 further comprises a controller 86 coupled to one or more of the process chamber 42, the substrate holder 52, the plasma generation system 62, and the vacuum pumping system 56, and is configured to exchange data with each of these components in order to execute a process within the process chamber 42 to treat the substrate 54.

Figure 4:
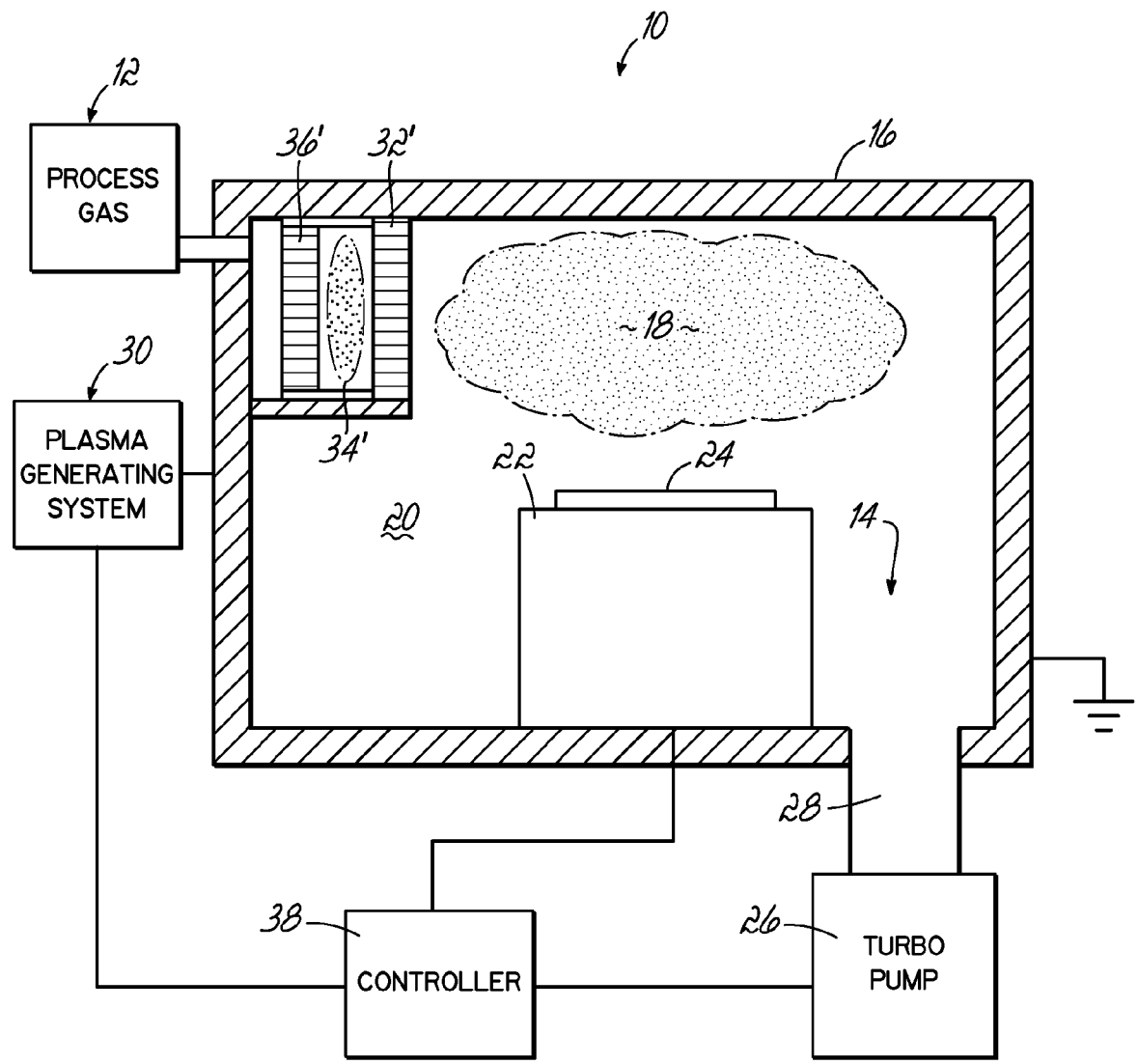
FIG. 4 is a schematic view of a plasma processing system, in cross-section, having an exhaust baffle assembly that protects gas injection ports coupled to the process gas source and in accordance with one embodiment of the present invention.
Figure 5:
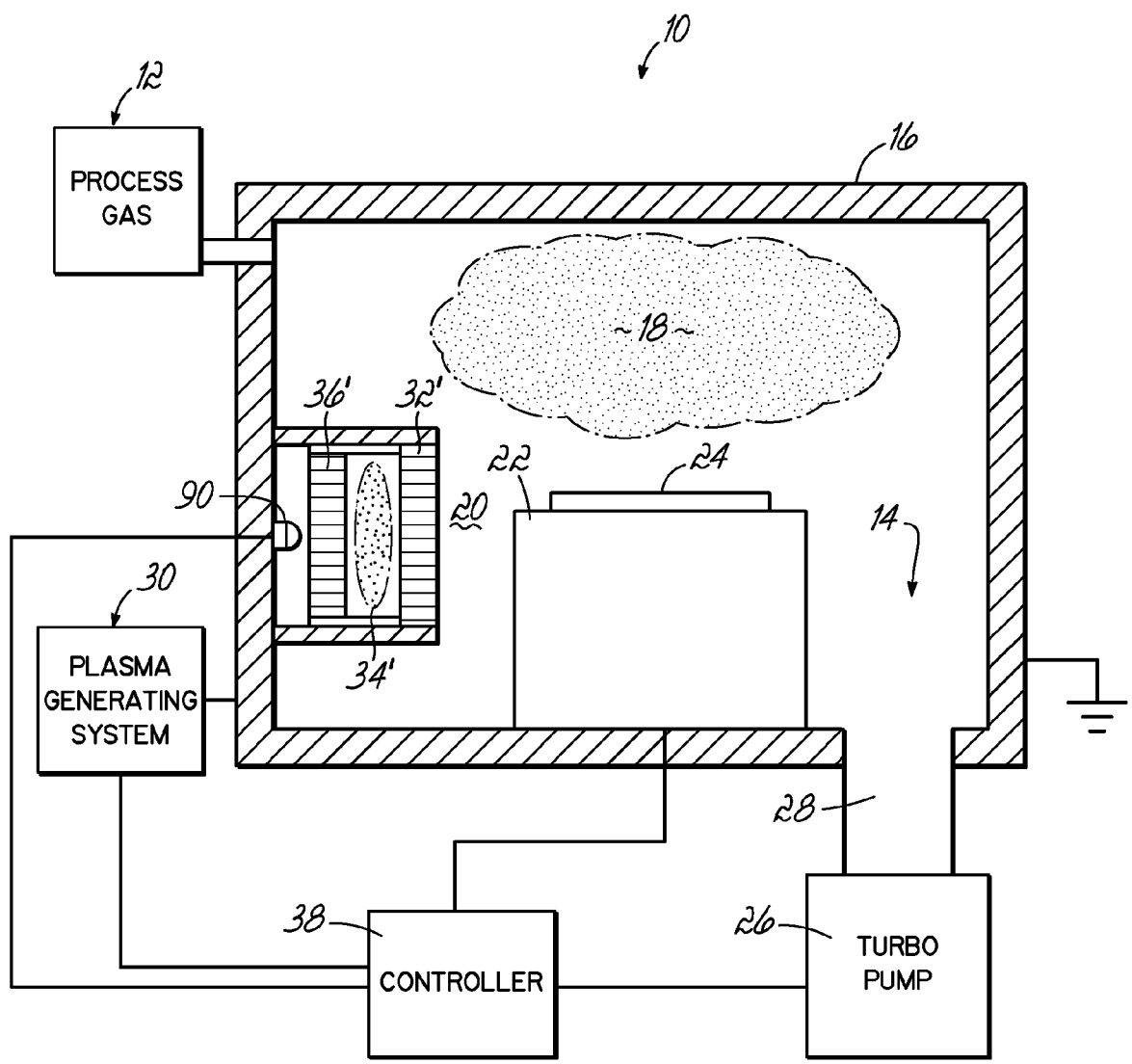
FIG. 5 is a schematic view of a plasma processing system, in cross-section, having an exhaust baffle assembly proximate to a sensor and in accordance with one embodiment of the present invention.

Referring now to FIGS. 4 and 5, plasma processing systems 10 in accordance with other embodiments of the present invention are shown and described in greater detail. That is, the first and second baffles 32', 36' may be positioned within the process chamber 16 so as to shield other plasma-sensitive components from the main plasma 18. For example, in FIG. 4 the gas injection ports coupled to the process gas source 12 may be protected by positioning the first and second baffles 32', 36' proximate to the gas injection ports. A separate assembly comprising a first and second baffle 32', 36' may be used for each gas injection port in a system with multiple gas injection ports. Alternatively, one assembly comprising a first and second baffle 32', 36' may be used to protect a plurality of closely-spaced gas injection ports (not shown).

Alternatively still, in FIG. 5 first and second baffles 32', 36' are positioned proximate to a sensor 90, which may include, for example, an optical sensor such as an optical emission spectroscopy sensor, an electrical probe, a residual gas analyzer, or some other process gas-sampling equipment, or generally any sensor that is configured to measure at least one process parameter associated with the plasma processing system 10. The first and second baffles 32', 36' not only reduce the chance of plasma exposure of the gas injection ports (FIG. 4) or the sensor 90 (FIG. 5), but also reduce the likelihood that materials may be deposited from the plasma and these components. Similarly, by preventing the plasma from reaching these components and possibly eroding them due to sputtering action and/or chemical attack, the likelihood of process contamination by material removed from these components by plasma action, is reduced.

Although not specifically shown, it would be appreciated from the description provided herein that the baffles and plates need not be planar. Instead, the pluralities of sub-Debye and super-Debye openings may be positioned within curved baffles, or otherwise configured to fit the shape of the process chamber.

It will be readily understood that while the embodiments of the present invention are illustrated herein with the processing surface of the substrate facing upwardly and the plasma generation system being positioned proximate an upper portion of the plasma processing system, it will be readily appreciated that such geometry is not limiting but, in fact, the processing surface of the substrate may be facing any particular direction so long as the plasma is formed between the processing surface and the first baffle.

While the present invention has been illustrated by description of various embodiments and while those embodiments have been described in considerable detail, those skilled in the art will readily appreciate that many modifications are possible in the exemplary embodiment without materially departing from the novel teachings and advantages of this invention. The invention in its broader aspects is therefore not limited to the specific details and illustrative examples shown and described. Accordingly, departures may be made from such details without departing from the spirit or scope of the present invention.

What is claimed is:

1. A plasma processing system comprising:
   a process chamber having first and second ends, the first end opposing the second end;
   a substrate support configured to support a substrate thereon, the substrate support being positioned at the first end of the process chamber;
   an exhaust system configured to draw a vacuum and operably coupled proximate the second end of the process chamber;
   a plurality of super-Debye openings positioned between the exhaust system and the substrate support and configured to limit diffusion of a plasma therethrough; and
   a plurality of sub-Debye openings positioned between the exhaust system and the plurality of super-Debye openings and configured to quench the diffusing plasma.

2. The plasma processing system of claim 1, further comprising:
   a process gas supply fluidically coupled to the process chamber and configured to inject at least one process gas therein.

3. The plasma processing system of claim 2, wherein the process gas supply further comprises:

a plurality of nozzles configured to disperse the at least one process gas between the plurality of super-Debye openings and the substrate.

4. The plasma processing system of claim 3, wherein each of the plurality of nozzles extends through a respective one of the plurality of super-Debye openings.

5. The plasma processing system of claim 1, wherein the plurality of super-Debye openings is positioned within a first baffle plate and the plurality of sub-Debye openings is positioned within a second baffle plate.

6. The plasma processing system of claim 5, wherein the first and second baffle plates are electrically floating, electrically grounded, or referenced to an RF, DC, or AC reference potential.

7. The plasma processing system of claim 1, wherein the plurality of super-Debye openings is positioned within a plurality of baffle plates.

8. The plasma processing system of claim 1, wherein the plurality of sub-Debye openings is positioned within a plurality of baffle plates.

9. The plasma processing system of claim 1, wherein the pluralities of super-Debye openings and sub-Debye openings are optimized to maximize gas transmission through the super-Debye openings and the sub-Debye openings of the pluralities.

10. The plasma processing system of claim 1, wherein the exhaust system includes a turbo pump positioned on an opposite side of the plurality of super-Debye openings and the plurality of sub-Debye openings from the substrate for drawing the vacuum without engaging the plasma.

11. The plasma processing system of claim 1, wherein the plurality of sub-Debye openings are included within a mesh-like material.

12. A plasma processing system comprising:
a process chamber;
a substrate positioned within the process chamber and having a processing surface;
a substrate support configured to support the substrate thereon such that the processing surface opposes the substrate support and faces a process space;
an exhaust system positioned such that the process space is between the processing surface of the substrate and the exhaust system, the exhaust system configured to draw a vacuum on the process space;
a plurality of super-Debye openings positioned between the exhaust system and the processing surface of the substrate and configured to limit diffusion of a plasma from the process space toward the exhaust system; and
a plurality of sub-Debye openings positioned between the exhaust system and the plurality of super-Debye openings and configured to quench a quiescent plasma diffusing from the plurality of super-Debye openings toward the exhaust system.

13. The plasma processing system of claim 12, further comprising:
a process gas supply fluidically coupled to the process chamber and configured to supply at least one process gas into the process space above the processing surface of the substrate; and
a plurality of nozzles configured to disperse the at least one process gas between the plurality of super-Debye openings and the substrate.

14. The plasma processing system of claim 13, wherein each of the plurality of nozzles extends through a respective one of the plurality of super-Debye openings.

15. The plasma processing system of claim 12, wherein the plurality of super-Debye openings are positioned within a first baffle plate and the plurality of sub-Debye openings are positioned within a second baffle plate.

16. The plasma processing system of claim 12, wherein the plurality of sub-Debye openings are included within a mesh-like material.

17. A method of operating a plasma processing system having a process chamber and configured to process a substrate, the method comprising:
positioning the substrate on a substrate holder within the process chamber such that a processing surface of the substrate faces a process space within the process chamber, the process space configured to contain a plasma therein;
injecting a process gas into the process space through a first plate for igniting the plasma, the first plate having a plurality of super-Debye openings therein, wherein a diameter of each of the plurality of super-Debye openings is greater than one Debye length of the plasma;
igniting the plasma from the process gas within the process space; and
operating a vacuum pump to exhaust the process gas and the plasma from the process space, through the first plate having the super-Debye openings therein, through a second plate having a plurality of sub-Debye openings therein, wherein a diameter of each of the plurality of sub-Debye openings is no greater than one Debye length of the plasma, and thereafter to the vacuum pump.

18. The method of claim 17, wherein the process gas is dispersed within a manifold before injecting through the first plate.

19. A plasma processing system comprising:
a process chamber having first and second ends, the first end opposing the second end;
a substrate support configured to support a substrate thereon, the substrate being positioned at the first end of the process chamber;
a gas supply having a gas injection port fluidically coupled with the process chamber and configured to inject a process gas into the process chamber;
a plurality of super-Debye openings positioned between the gas injection port and the substrate support and configured to permit transmission of process gas to the process chamber and to limit diffusion of a plasma from the process chamber to the gas injection port; and
a plurality of sub-Debye openings positioned between the gas injection port and the plurality of super-Debye openings and configured to quench a quiescent plasma.

20. A plasma processing system comprising:
a process chamber having first and second ends, the first end opposing the second end;
a substrate support configured to support a substrate thereon, the substrate support being positioned at the first end of the process chamber;
a sensor operably coupled to the process chamber and configured to detect at least one process parameter within the process chamber;
a plurality of super-Debye openings positioned between the sensor and the substrate support and configured to limit diffusion of a plasma from the process chamber to the sensor; and
a plurality of sub-Debye openings positioned between the sensor and the plurality of super-Debye openings and configured to quench a quiescent plasma.

* * * * *